(12) United States Patent
Ohno et al.

(10) Patent No.: US 11,976,351 B2
(45) Date of Patent: May 7, 2024

(54) TITANIUM OXIDE OPTICAL DEVICE FILMS DEPOSITED BY PHYSICAL VAPOR DEPOSITION

(71) Applicant: Applied Materials, Inc., Santa Clara, CA (US)

(72) Inventors: Kenichi Ohno, Sunnyvale, CA (US); Andrew Ceballos, Palo Alto, CA (US); Karl J. Armstrong, Sunnyvale, CA (US); Takashi Kuratomi, San Jose, CA (US); Rami Hourani, Santa Clara, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 39 days.

(21) Appl. No.: 17/692,465

(22) Filed: Mar. 11, 2022

(65) Prior Publication Data
US 2022/0290290 A1    Sep. 15, 2022

Related U.S. Application Data

(60) Provisional application No. 63/159,641, filed on Mar. 11, 2021.

(51) Int. Cl.
*G02B 1/10*      (2015.01)
*C03C 17/245*    (2006.01)
(Continued)

(52) U.S. Cl.
CPC ........ *C23C 14/083* (2013.01); *C03C 17/2456* (2013.01); *C23C 14/35* (2013.01);
(Continued)

(58) Field of Classification Search
CPC ....... C23C 14/083; C23C 14/35; C23C 14/54; C23C 14/0036; C23C 14/08;
(Continued)

(56) References Cited

U.S. PATENT DOCUMENTS 5,944,964 A * 8/1999 Solberg ................. G02B 1/115
                                                  204/192.12
9,052,456 B2 * 6/2015 Hassan ................... C03C 17/06
(Continued)

FOREIGN PATENT DOCUMENTS

WO    2014063954 A1    5/2014

OTHER PUBLICATIONS

International Search Report dated Jun. 22, 2022 for Application No. PCT/US2022/019905.

*Primary Examiner* — Balram T Parbadia
(74) *Attorney, Agent, or Firm* — Patterson + Sheridan, LLP

(57) ABSTRACT

An optical device is provided. The optical device includes an optical device substrate having a first surface; and an optical device film disposed over the first surface of the optical device substrate. The optical device film is formed of titanium oxide. The titanium oxide is selected from the group of titanium(IV) oxide ($TiO_2$), titanium monoxide (TiO), dititanium trioxide ($Ti_2O_3$), $Ti_3O$, $Ti_2O$, $\delta$-$TiO_x$, where x is 0.68 to 0.75, and $Ti_nO_{2n-1}$, where n is 3 to 9, the optical device film has a refractive index greater than 2.72 at a 520 nanometer (nm) wavelength, and a rutile phase of the titanium oxide comprises greater than 94 percent of the optical device film.

20 Claims, 3 Drawing Sheets

(51) Int. Cl.
*C23C 14/08* (2006.01)
*C23C 14/35* (2006.01)
*C23C 14/54* (2006.01)
*G02B 1/04* (2006.01)

(52) U.S. Cl.
CPC ............ *C23C 14/54* (2013.01); *G02B 1/10* (2013.01); *G02B 1/041* (2013.01)

(58) Field of Classification Search
CPC ...... C03C 17/2456; G02B 1/10; G02B 1/041; G02B 2027/0118; G02B 2027/0178; G02B 1/02; G02B 5/1809
See application file for complete search history.

(56) References Cited

U.S. PATENT DOCUMENTS

| | | | |
|---|---|---|---|
| 2002/0187371 A1* | 12/2002 | Nakajima | C23C 16/545 427/255.28 |
| 2003/0003304 A1* | 1/2003 | Ohtsu | C03C 17/2456 428/412 |
| 2003/0043464 A1 | 3/2003 | Dannenberg | |
| 2003/0091500 A1* | 5/2003 | Koinuma | H01F 10/007 423/598 |
| 2004/0258947 A1* | 12/2004 | Moelle | C23C 14/34 428/632 |
| 2006/0255739 A1* | 11/2006 | Ritz | C23C 14/08 313/635 |
| 2006/0257669 A1 | 11/2006 | Ritz et al. | |
| 2008/0074748 A1 | 3/2008 | Kittaka et al. | |
| 2012/0161090 A1* | 6/2012 | Zhu | C01G 23/047 252/587 |
| 2016/0244874 A1 | 8/2016 | Ge et al. | |
| 2019/0004422 A1* | 1/2019 | Taguchi | G03F 7/031 |
| 2019/0033504 A1* | 1/2019 | Miyata | B32B 27/42 |
| 2022/0317337 A1* | 10/2022 | Kurihara | C03C 17/2456 |

* cited by examiner

TITANIUM OXIDE OPTICAL DEVICE FILMS DEPOSITED BY PHYSICAL VAPOR DEPOSITION

CROSS-REFERENCE TO RELATED APPLICATIONS

This application claims the benefit of U.S. Provisional Patent Application No. 63/159,641, filed on Mar. 11, 2021, the contents of which are herein incorporated by reference.

BACKGROUND

Field

Embodiments of the present disclosure generally relate to optical devices. More specifically, embodiments described herein relate to an optical device film, an optical device formed from the optical device film, and a method forming an optical device film with a refractive index greater than or equal to about 2.72 at a wavelength of 520 nanometers (nm).

Description of the Related Art

Virtual reality is generally considered to be a computer generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated to appear as part of the environment. Augmented reality can include any type of input, such as audio and haptic inputs, as well as virtual images, graphics, and video that enhances or augments the environment that the user experiences. As an emerging technology, there are many challenges and design constraints with augmented reality.

One such challenge is displaying a virtual image overlaid on an ambient environment. Optical devices including waveguide combiners, such as augmented reality waveguide combiners, and flat optical devices, such as metasurfaces, are used to assist in overlaying images. Generated light is propagated through an optical device until the light exits the optical device and is overlaid on the ambient environment. Optical devices may require optical device structures with a refractive index greater than or equal to about 2.70 at a wavelength of 520 nanometers.

Accordingly, what is needed in the art is an optical device film, an optical device formed from the optical device film, and a method forming an optical device film with a refractive index greater than or equal to about 2.70 at a wavelength of 520 nanometers.

SUMMARY

In one embodiment, an optical device is provided. The optical device includes an optical device substrate having a first surface; and an optical device film disposed over the first surface of the optical device substrate, wherein the optical device film is formed of titanium oxide, the titanium oxide is selected from the group consisting of titanium(IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, and $Ti_nO_{2n-1}$, where n is 3 to 9, the optical device film has a refractive index greater than 2.72 at a 520 nanometer (nm) wavelength, and a rutile phase of the titanium oxide comprises greater than 94 percent of the optical device film.

In another embodiment, an optical device is provided. The optical device includes an optical device substrate having a first surface; and a plurality of optical device structures disposed over the first surface of the optical device substrate, the plurality of optical device structures spaced apart from each other in a direction parallel to the first surface, wherein each optical device structure of the plurality of optical device structures is formed of titanium oxide, the titanium oxide is selected from the group consisting of titanium oxide titanium(IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, and $TinO_{2n-1}$, where n is 3 to 9, each optical device structure has a refractive index greater than 2.72 at a 520 nanometer (nm) wavelength, and a rutile phase of the titanium oxide comprises greater than 94 percent of the optical device structures.

In another embodiment, a method is provided. The method includes disposing an optical device substrate on a substrate support in a processing volume of a process chamber, the optical device substrate having a first surface; and depositing an optical device film of titanium oxide over the first surface of the optical device substrate using a physical vapor deposition (PVD) process, wherein the PVD process comprises providing a flowrate of a sputter gas and a flowrate of an oxygen-containing gas to the processing volume and providing RF energy to a target disposed in the process volume, the optical device film has a refractive index greater than 2.72 at a 520 nanometer (nm) wavelength, and a rutile phase of titanium oxide comprises greater than 94 percent of the optical device film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to optical devices. More specifically, embodiments described herein relate to an optical device film, an optical device formed from the optical device film, and a method forming an optical device film with a refractive index greater than or equal to about 2.70 (e.g., greater than or equal to about 2.75) at a wavelength of 520 nanometers.

Figure 1:
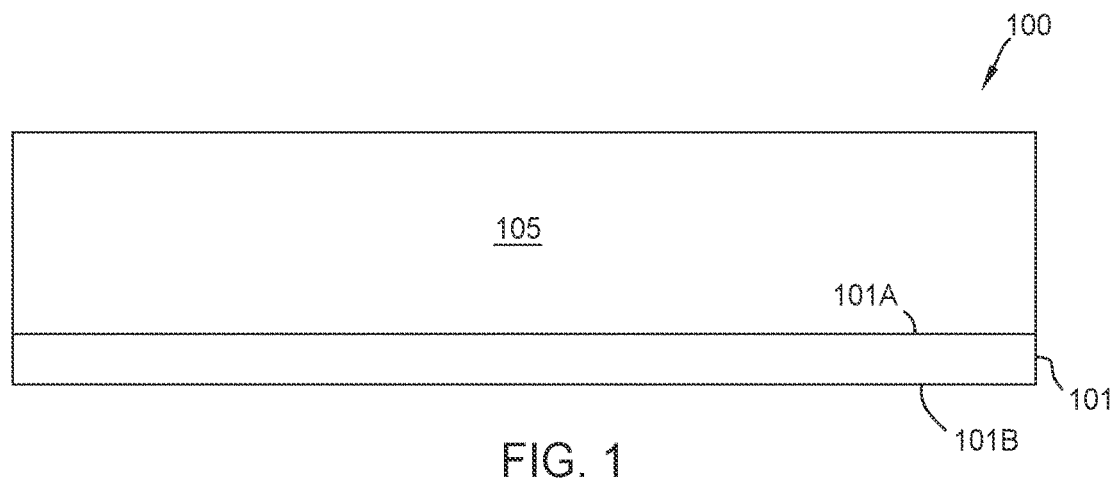
FIG. 1 is a schematic, cross-sectional view of an optical device, according to one embodiment.

FIG. 1 is a schematic, cross-sectional view of an optical device 100, according to one embodiment. The optical device 100 includes an optical device substrate 101 and an optical device film 105. The optical device substrate 101 includes a first surface 101A and an opposing second surface 101B. The optical device film 105 is disposed over the first surface 101A of the optical device substrate 101. In some embodiments, the optical device film 105 is disposed directly on the first surface 101A of the substrate 101.

The substrate 101 is any suitable optical device substrate. The substrate 101 can be formed of any suitable material, provided that the substrate 101 can adequately transmit light of a specified wavelength or wavelength range and can serve as an adequate support for one or more optical devices formed on the substrate 101.

In some embodiments, the substrate 101 can be formed of materials including, but not limited to, amorphous dielectrics, crystalline dielectrics, silicon, silicon oxide, silicon carbide, silica (e.g., fused silica), sapphire, glass, magnesium oxide, diamond, lanthanum oxide, one or more polymers, oxide materials, sulfide materials, phosphide materials, telluride materials, or combinations thereof. In some embodiments, which can be combined with other embodiments described herein, the substrate 101 includes an optically transparent material.

The optical device film 105 includes titanium oxide. In some embodiments, the optical device film 105 is formed entirely of titanium oxide. The titanium oxide is selected from the group consisting of titanium(IV) oxide ($TiO_2$), titanium monoxide (TiO), dititanium trioxide ($Ti_2O_3$), $Ti_3O$, $Ti_2O$, $\delta$-$TiO_x$, where x is 0.68 to 0.75, or $TinO_{2n-1}$, where n is 3 to 9. Examples of $TinO_{2n-1}$ include $Ti_3O_5$ and $Ti_4O_7$. In some embodiments, the optical device film 105 can have a thickness in the Y-direction from about 1 nm to about 1000 nm, such as from about 45 nm to about 150 nm.

In some embodiments, the optical device film 105 of titanium oxide has a rutile phase greater than 50 percent (i.e., greater than 50 percent of the optical device film 105 is in the rutile phase). In some embodiments, the optical device film 105 of titanium oxide has a rutile phase greater than 90 percent (i.e., greater than 90 percent of the optical device film 105 is in the rutile phase). In some of these embodiments, the titanium oxide can include rutile phase and anatase phase. In some of these embodiments, the anatase phase is less than 50 percent, for example less than 10 percent. In some embodiments, the titanium oxide can consist entirely of rutile phase and anatase phase (i.e., including no amorphous titanium oxide or any other form of titanium oxide).

In some embodiments, the optical device film 105 of titanium oxide has a rutile phase greater than 94 percent (i.e., greater than 94 percent of the optical device film 105 is in the rutile phase). In some of these embodiments, the titanium oxide can be entirely in the rutile phase. In some of these embodiments, the titanium oxide can include rutile phase and anatase phase. In some of these embodiments, the anatase phase is less than six percent. In some embodiments, the titanium oxide can consist entirely of rutile phase and anatase phase (i.e., including no amorphous or any other form of titanium oxide). As described in further detail below, controlling a ratio of a flowrate of an oxygen-containing gas to a flowrate of a sputter gas can be used to adjust a percentage of a titanium oxide layer that is formed in the rutile phase.

The rutile phase of titanium oxide has a higher refractive index than the anatase phase of titanium oxide. For example, the anatase phase of titanium oxide can have a refractive index of 2.68 when exposed to light at 520 nm while the rutile phase of titanium oxide can have a refractive index of 2.8 when exposed to light at 520 nm. Optical device films having a higher refractive index (e.g., >2.70) can be useful for certain optical device applications, such as for use in a waveguide combiner to be used in an augmented reality application. Forming a layer of titanium oxide to have the structure of the rutile phase generally requires high energy (e.g., temperatures >600° C.), which can be costly, and in some cases potentially damaging to other materials that may be present on the substrate 101. As provided in more detail below, methods are provided for forming a titanium oxide layer having the structure of the rutile phase at temperatures below 600° C., such as from about room temperature to about 500° C. (e.g., 400° C.). This temperature can refer to the temperature of the substrate 101 or the substrate support 316. Furthermore, the titanium oxide layers that can be formed from the methods provided below can have a smooth surface without any large grains, which can be useful for optical applications. In some embodiments, the optical device film 105 formed by the methods provided below can have a surface roughness less than 2.5 nm, such as less than 1.5 nm, such as about 1.0 nm. Also, in some embodiments, the average grain size for the titanium oxide layers formed can be from about 3.6 nm to about 7.6 nm. Additionally, the titanium oxide layers that can be formed from the methods provided below can have zero or less than 1% amorphous phase in the structure of the titanium oxide layer making the layers formed by the methods described below more useful for optical applications.

In some embodiments, the optical device film 105 of the titanium oxide has a refractive index greater than or equal to (1) 2.70 at a wavelength of 520 nm; (2) 2.85 at a wavelength of 465 nm, (3) 2.78 at a wavelength of 500 nm, (4) 2.74 at a wavelength of 532 nm, and (5) 2.65 at a wavelength of 633 nm.

Figure 2:
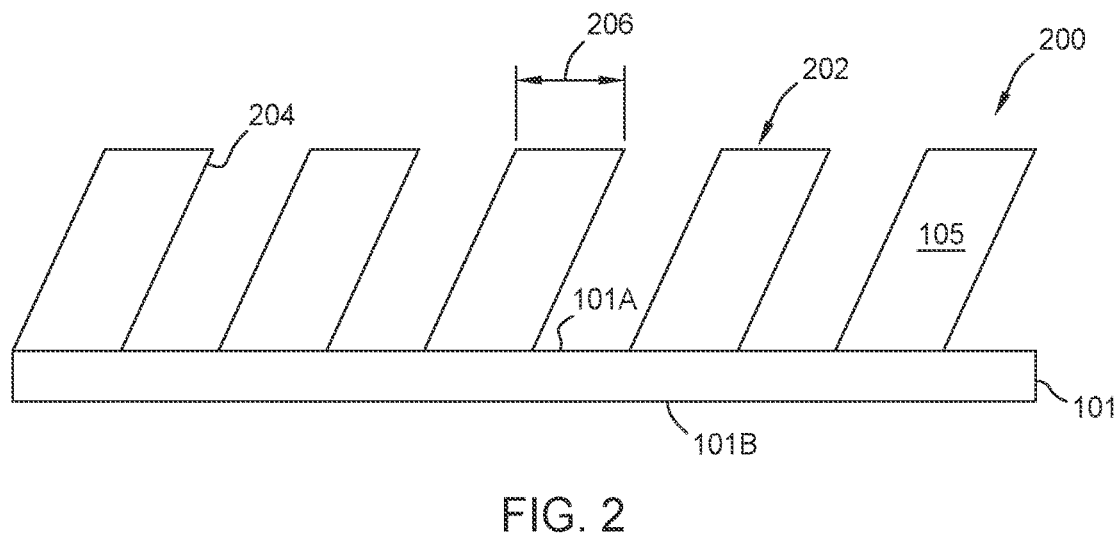
FIG. 2 is a schematic, cross-sectional view of an optical device, according to one embodiment.

FIG. 2 is a schematic, cross-sectional view of an optical device 200, according to one embodiment. The optical device 200 is formed from the optical device film 105. In one embodiment, which can be combined with other embodiments described herein, the optical device 200 is a waveguide combiner, such as an augmented reality waveguide combiner. In another embodiment, which can be combined with other embodiments described herein, the optical device 200 is a flat optical device, such as a metasurface. Other optical devices that can be formed from the optical device film 105 include optical filters and dielectric mirrors.

The optical device 200 includes optical device structures 202 disposed over (e.g., directly on) the first surface 101A of the substrate 101. The plurality of optical device structures 202 can be spaced apart from each other in a direction parallel to the first surface 101A of the substrate 101. The optical device structures 202 include sub-micron critical dimensions, e.g., nanosized dimensions, corresponding to the widths 206 of the optical device structures 202. In some embodiments, the optical device structures 202 may be binary structures (not shown) with sidewalls 204 perpendicular to the first surface 101A of the substrate 101. In other embodiments, the optical device structures 202 may be angled structures with at least one of the sidewalls 204 angled relative to the first surface 101A of the substrate 101.

The optical device structures 202 can be formed from the optical device film 105 via one or more lithography and/or etch processes.

The optical device structures 202 are formed from the optical device film 105. Thus, the optical device structures 202 can have the same refractive indexes as the optical device film 105 described above when exposed to different wavelengths of light. As noted above, these refractive indexes are a result of the titanium oxide having a rutile phase greater than 90 percent, such as greater than 94 percent, for example between 94 percent and 97 percent, such as between 94 percent and 95 percent.

Figure 3:
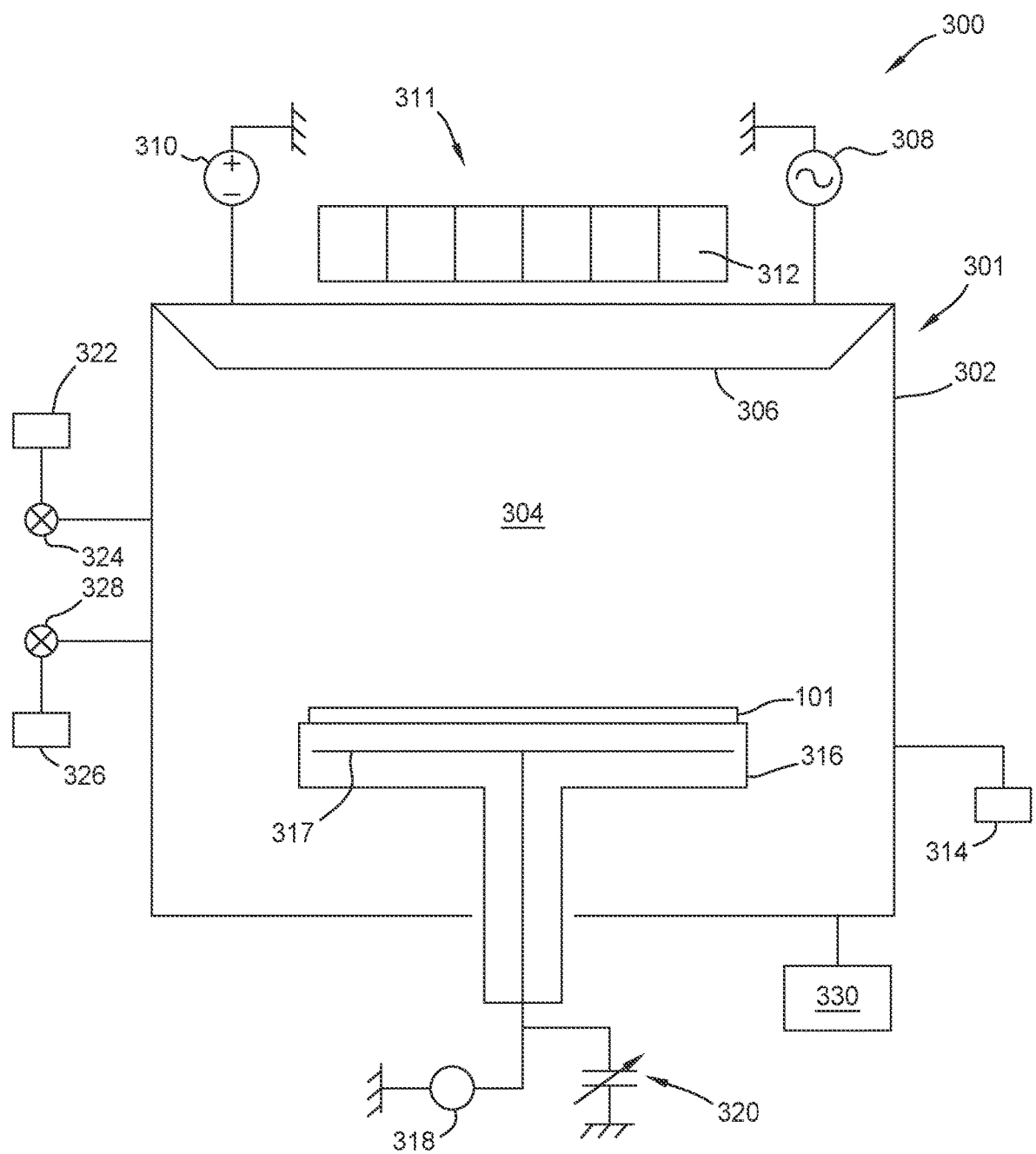
FIG. 3 is a schematic, cross-sectional view of a process system, according to one embodiment.

FIG. 3 is a schematic, cross-sectional view of a processing system 300, according to one embodiment. The processing system 300 includes a process chamber 301. The processing system 300 may be used to perform the methods described herein. The process chamber 301 is a physical vapor deposition (PVD) chamber. It is to be understood that the chamber 301 is an exemplary physical vapor deposition (PVD) chamber and other PVD chambers, including PVD chambers from other manufacturers, may be used with or modified to accomplish the methods of the present disclosure, such as forming the optical device film 105 shown in FIG. 1.

The chamber 301 includes a chamber body 302 defining a processing volume 304. The chamber 301 further includes a target 306 disposed in the processing volume 304. The target 306 is a titanium target.

The processing system 300 can further include an RF power supply 308 and a DC power supply 310. The target 306 can be coupled to the RF power supply 308 and the DC power supply 310. Power provided from RF power supply 308 and/or the DC power supply 310 to the target 306 can be used to ignite a plasma composed of a sputter gas, such as argon (Ar), and a reactive gas, i.e., an oxygen-containing gas, in the processing volume 304, for example by capacitive coupling therewith.

The chamber 301 may further include a magnetron assembly 311. The magnetron assembly 311 can be configured to direct magnetic fields to regions around the target 306 in the processing volume 304. These magnetic fields can help increase a density of the plasma formed in the processing volume 304 around the target 306. In one embodiment, the magnetron assembly 311 can include a plurality of magnets 312 (e.g., strength magnets) arranged to provide a magnetic field which extends through the target 306 and into the processing volume 304. In some embodiments, the generated magnetic fields can trap electrons along magnetic field lines to increase the plasma ion density by enabling additional electron-gas atom collisions.

The processing system 300 can further include a vacuum source 314. The processing volume 304 is fluidly coupled to the vacuum source 314, such as a vacuum pump. The vacuum source 314 can be used to maintain the processing volume 304 at a specified process pressure and to evacuate sputter gases, reactive gases, and other gases from the processing volume 304.

The chamber 301 can further include a substrate support 316 disposed in the processing volume 304. The substrate support 316 can include an electrode 317. In some embodiments, the substrate support 316 can be operable to secure (e.g., chuck) the substrate 101 to the substrate support 316.

In some embodiments, the processing system 300 further includes a power source 318. The power source 318 can be coupled to the electrode 317 in the substrate support 316 in order to induce an electrical bias on the substrate 101. The power source 318 may be a RF or DC power source. In other embodiments, a self-bias may form on the substrate 101 during processing. In some embodiments, the electrode 317 may be coupled to an auto capacitance tuner (ACT) 320. The ACT 320 is operable to adjust the capacitance (and thus impedance) from the substrate support 316 to ground.

The processing system 300 can further include a sputter gas source 322 and a reactive gas source 326. A sputter gas flow controller 324, such as a mass flow controller (MFC), can be disposed between the sputter gas source 322 and the processing volume 304 to control a flow of the sputter gas (e.g., argon) from the sputter gas source 322 to the processing volume 304. A reactive gas flow controller 328, such as an MFC, can be disposed between a reactive gas source 326 and the process volume 304 to control a flow of the reactive gas (e.g., oxygen) from the reactive gas source 326 to the processing volume 304. A controller 330 is coupled to the chamber 301 and configured to control aspects of the processing system 300 during processing, such as during methods of forming the optical device film 105 (FIG. 1).

Figure 4:
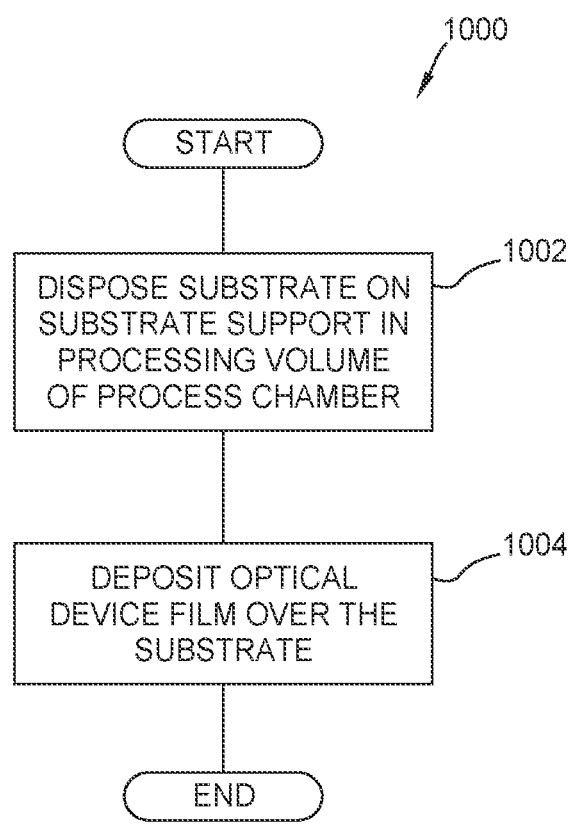
FIG. 4 is a process flow diagram of a method of forming the optical device shown in FIG. 1, according to one embodiment.

FIG. 4 is a process flow diagram of a method 1000 of forming the optical device 100 shown in FIG. 1, according to one embodiment. The method 1000 can be performed using the processing system 300 described above in reference to FIG. 3. However, it is to be noted that PVD chambers other than the chamber 301 may be utilized in conjunction with method. The method 1000 forms an optical device film 105 of a titanium oxide having the rutile phase greater than 90 percent, such as greater than 94 percent and having a refractive index greater than or equal to about 2.72, such as greater than or equal to about 2.75 at a wavelength of 520 nanometers.

The method 1000 begins at block 1002. At block 1002, the optical device substrate 101 is positioned on the substrate support 316 in the process chamber 301.

At block 1004, the optical device film 105 is formed over the substrate 101. In some embodiments, the optical device film 105 is formed directly on the first surface 101A of the substrate 101. The optical device film 105 is generally formed by a PVD process. During the PVD process at block 1004, an oxygen-containing gas (e.g., $O_2$) can be provided to the processing volume 304 from the reactive gas source 326, and a sputter gas (e.g., argon) can be provided from sputter gas source 322 to the processing volume 304. Although not shown, the method 1000 can be continued with additional etch and/or lithography steps to form the optical device 200 shown in FIG. 2 after the deposition of the optical device film 105 performed at block 1004.

During block 1004, power can be provided to the target 306 from the RF power supply 308 and/or the DC power supply 310 to ignite a plasma in the processing volume 304. In some embodiments, the DC power from the DC power supply 310 can be pulsed to generate the plasma. The target 306 can be formed of titanium. In one embodiment, RF power can be provided from the RF power supply 308 to target 306 at a power level from about 1 kW to about 10 kW, such as about 5 kW, for example at a frequency of 13.56 MHz. In one embodiment, DC power can be provided from the DC power supply 310 to the target 306 at a power level 1 kW to about 10 kW, such as about 5 kW. As mentioned above, the magnetron assembly 311 can direct magnetic fields to regions around the target 306 in the processing volume 304. These magnetic fields can help increase a density of the plasma formed during block 1004 in the processing volume 304 around the target 306.

During block 1004, the plasma of the sputter gas (e.g., argon) can bombard the target 306 causing titanium atoms to be ejected from the target 306. The DC power can be used to attract ions and or radicals of the sputter gas as well as electrons to sputter the material from the target 306. After being ejected from the target 306, the titanium and the oxygen can be deposited as titanium oxide over the first surface 101A of the substrate 101. The deposited titanium oxide can be selected from the group consisting of titanium (IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, or $TinO_{2n-1}$, where n is 3 to 9. Examples of $TinO_{2n-1}$ include $Ti_3O_5$ and $Ti_4O_7$. As mentioned above, the titanium oxide can be deposited under conditions that result in the titanium oxide depositing primarily in the rutile phase (e.g., 94% or more of the deposited titanium oxide has the rutile phase) and having a refractive index greater than or equal 2.72 at a wavelength of 520 nm, such as greater than or equal 2.75 at a wavelength of 520 nm. In some embodiments, for other wavelengths of light, the optical device film 105 of the titanium oxide deposited at block 1004 can have a refractive index greater than or equal to (1) 2.85 at a wavelength of 465 nm, (2) 2.78 at a wavelength of 500 nm, (3) 2.74 at a wavelength of 532 nm, and (4) 2.65 at a wavelength of 633 nm.

To deposit the optical device film 105 of the titanium oxide with the rutile phase greater than 90 percent (e.g., >94 percent) and the refractive index greater than or equal to 2.72 (at 520 nm), such as greater than 2.75 (at 520 nm) the PVD process operates in a metallic mode, which means the target 306 does not oxidize during the deposition.

Notably, the temperature during the deposition that forms the primarily rutile phase of titanium oxide is performed at lower temperatures than temperatures commonly used to form the rutile phase of titanium oxide, which are typically greater than 600° C. or 800° C. For example, the temperature during the deposition at block 1004 can be less than 600° C., such as from about room temperature to about 500° C. (e.g., 400° C.). This temperature can refer to the temperature of the substrate 101 or the substrate support 316.

In one embodiment, which can be combined with other embodiments described herein, a process pressure in the processing volume 304 is less than or equal to 50 mTorr, such as less than or equal to 20 mTorr, such as less than or equal to 10 mTorr (e.g., between 1 mTorr and 10 mTorr). In some embodiments, the auto capacitance tuner (ACT) 320 can be adjusted to control the bias of the substrate support 316 during the deposition, which can assist in obtaining a consistent flow of deposition material towards the substrate 101.

In another embodiment, which can be combined with other embodiments described herein, a ratio of the flowrate of the sputter gas (e.g., argon) to the flowrate of the reactive gas (e.g., $O_2$) can be between about 1:0.1 to about 1:6, such as a ratio between about 1:1 and about 1:3. For example, in one embodiment, a ratio of the flowrate of the sputter gas to the flowrate of the reactive gas that is about 1:1.6. In one example, argon is provided into the processing volume 304 at a flowrate of about 5 sccm and the oxygen-containing gas (e.g., $O_2$) is flowed into the processing volume 304 at a flowrate of about 8 sccm. Within the flowrate ratios mentioned above, decreasing the flowrate of the oxygen-containing gas relative to the flowrate of the sputter gas has been found to increase the proportion of titanium oxide deposited in the rutile phase relative to the proportion of titanium oxide deposited in the anatase phase. Furthermore, lower process pressures within the ranges mentioned above have been found to increase the proportion of titanium oxide deposited in the rutile phase relative to the proportion of titanium oxide deposited in the anatase phase.

These ratios of the flowrate of the sputter gas to the flowrate of the reactive gas as well as the maintaining the pressure in the processing volume less than or equal to 10 mTorr can assist in keeping the target 306 operating in metallic mode during the deposition. In the metallic mode the target is not oxidized and a majority of the reactive gas (e.g., $O_2$) flowed into the processing volume is consumed as part of deposition of titanium oxide in the optical device film 105.

In summation, an optical device film, an optical device formed from the optical device film, and a method of forming an optical device film with a refractive index greater than or equal to 2.72 at a wavelength of 520 nm, such as greater than or equal to 2.75 at a wavelength of 520 nm are provided in this disclosure. The optical device film 105 is formed of titanium oxide with greater than 90 percent (e.g., >94 percent) of the optical device film 105 in a rutile phase. The rutile phase greater than 94 percent provides for the refractive index greater than or equal to 2.72 or greater than or equal to 2.75. Furthermore, as noted above the process described above allows for formation of the rutile phase of titanium oxide at temperatures lower than 600° C., such as about 400° C., which is significantly lower than temperatures typically used to form the rutile phase of titanium oxide. Thus, a titanium oxide layer with a high refractive index (e.g., 2.75) can be formed at a relatively low temperature (e.g., 400° C.) using the methods provided above.

While the foregoing is directed to examples of the present disclosure, other and further examples of the disclosure may be devised without departing from the basic scope thereof, and the scope thereof is determined by the claims that follow.

What is claimed is:

1. An optical device comprising:
    an optical device substrate having a first surface; and
    an optical device film disposed over the first surface of the optical device substrate, wherein
        the optical device film includes a first side facing the first surface of the optical device substrate,
        the optical device film includes a first side surface and an opposing second side surface, the first side surface and the second side surface each extending from the first side of the optical device film,
        the optical device film is formed of titanium oxide continuously from the first side surface to the second side surface,
        the titanium oxide is selected from the group consisting of titanium(IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, and $Ti_nO_{2n-1}$, where n is 3 to 9,
        the optical device film has a refractive index greater than 2.72 at a 520 nanometer (nm) wavelength, and
        a rutile phase of the titanium oxide comprises greater than 94 percent of the optical device film.

2. The optical device of claim 1, wherein the optical device film has a refractive index greater than 2.75 at a 520 nm wavelength.

3. The optical device of claim 1, wherein the refractive index of the optical device film is greater than or equal to 2.85 at a 465 nm wavelength, greater than or equal to 2.78 at a 500 nm wavelength, greater than or equal to 2.74 at a 532 nm wavelength, and greater than or equal to 2.65 at a 633 nm wavelength.

4. The optical device of claim 1, wherein the optical device film is formed of a continuous layer of titanium oxide.

5. An optical device comprising:
an optical device substrate having a first surface; and
a plurality of optical device structures disposed over the first surface of the optical device substrate, the plurality of optical device structures spaced apart from each other in a direction parallel to the first surface, wherein each optical device structure includes a first side facing the first surface of the optical device substrate,
each optical device structure includes a first side surface and an opposing second side surface, the first side surface and the second side surface each extending from the first side of the corresponding optical device structure,
each optical device structure of the plurality of optical device structures is formed of titanium oxide continuously from the first side surface to the second side surface,
the titanium oxide is selected from the group consisting of titanium oxide titanium(IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, and $Ti_nO_{2n-1}$, where n is 3 to 9,
each optical device structure has a refractive index greater than 2.72 at a 520 nanometer (nm) wavelength, and
a rutile phase of the titanium oxide comprises greater than 94 percent of the optical device structures.

6. The optical device of claim 5, wherein each optical device structure has a refractive index
greater than 2.75 at a 520 nm wavelength.

7. The optical device of claim 5, wherein the refractive index of each optical device structure is greater than or equal to 2.85 at a 465 nm wavelength, greater than or equal to 2.78 at a 500 nm wavelength, greater than or equal to 2.74 at a 532 nm wavelength, and greater than or equal to 2.65 at a 633 nm wavelength.

8. The optical device of claim 5, wherein each optical device structure is formed of a continuous layer of titanium oxide.

9. A method, comprising:
disposing an optical device substrate on a substrate support in a processing volume of a process chamber, the optical device substrate having a first surface; and
depositing an optical device film of titanium oxide over the first surface of the optical device substrate using a physical vapor deposition (PVD) process, wherein
the optical device film includes a first side facing the first surface of the optical device substrate,
the optical device film includes a first side surface and an opposing second side surface, the first side surface and the second side surface each extending from the first side of the optical device film,
the optical device film is formed of titanium oxide continuously from the first side surface to the second side surface,
the PVD process comprises providing a flowrate of a sputter gas and a flowrate of an oxygen-containing gas to the processing volume and providing RF energy to a target disposed in the process volume,
the titanium oxide is selected from the group consisting of titanium(IV) oxide ($TiO_2$), titanium monoxide (TiO), dititanium trioxide ($Ti_2O_3$), $Ti_3O$, $Ti_2O$, $\delta\text{-}TiO_x$, where x is 0.68 to 0.75, and $Ti_nO_{2n-1}$, where n is 3 to 9,
the optical device film has a refractive index greater than 2.72 at a 520 nanometer (nm) wavelength,
a pressure in the processing volume is less than or equal to 50 mTorr during the depositing of the optical device film, and
a rutile phase of titanium oxide comprises greater than 94 percent of the optical device film.

10. The method of claim 9, wherein the optical device film has a refractive index greater than 2.75 at a 520 nm wavelength.

11. The method of claim 9, wherein a ratio of the flowrate of the sputter gas to the flowrate of the oxygen-containing gas is between about 1:0.1 to about 1:6.

12. The method of claim 9, wherein a ratio of the flowrate of the sputter gas to the flowrate of the oxygen-containing gas is between about 1:1 to about 1:3.

13. The method of claim 12, wherein the pressure in the processing volume is less than or equal to 10 mTorr during the depositing of the optical device film.

14. The method of claim 9, wherein the pressure in the processing volume is less than or equal to 10 mTorr during the depositing of the optical device film.

15. The method of claim 9, wherein a ratio of the flowrate of the sputter gas to the flowrate of the oxygen-containing gas is between about 1:0.1 to about 1:1.6.

16. The method of claim 9, wherein the PVD process further comprises providing DC power to the target during the depositing of the optical device film.

17. The method of claim 9, wherein the process chamber includes a magnetron assembly and the PVD process further comprises directing magnetic fields from the magnetron assembly to regions around the target in the processing volume during the depositing of the optical device film.

18. The method of claim 9, further comprising adjusting a bias of the substrate support during the depositing of the optical device film using an auto capacitance tuner.

19. The method of claim 9, wherein the refractive index of the optical device film is greater than or equal to 2.85 at a 465 nm wavelength, greater than or equal to 2.78 at a 500 nm wavelength, greater than or equal to 2.74 at a 532 nm wavelength, and greater than or equal to 2.65 at a 633 nm wavelength.

20. The method of claim 9, wherein the optical device film is formed of a continuous layer of titanium oxide.

* * * * *